United States Patent
Paraschou et al.

(10) Patent No.: US 10,122,392 B2
(45) Date of Patent: Nov. 6, 2018

(54) ACTIVE EQUALIZING NEGATIVE RESISTANCE AMPLIFIER FOR BI-DIRECTIONAL BANDWIDTH EXTENSION

(71) Applicant: Advanced Micro Devices, Inc., Sunnyvale, CA (US)

(72) Inventors: Milam Paraschou, Dellwood, MN (US); Gerald R. Talbot, Concord, MA (US); Dean E. Gonzales, Fort Collins, CO (US)

(73) Assignee: Advanced Micro Devices, Inc., Santa Clara, CA (US)

( * ) Notice: Subject to any disclaimer, the term of this patent is extended or adjusted under 35 U.S.C. 154(b) by 31 days.

(21) Appl. No.: 15/240,549

(22) Filed: Aug. 18, 2016

(65) Prior Publication Data

US 2018/0054223 A1    Feb. 22, 2018

(51) Int. Cl.
*H04B 1/38* (2015.01)
*H04L 5/16* (2006.01)
*H04B 1/04* (2006.01)
*H03F 3/45* (2006.01)

(52) U.S. Cl.
CPC ....... *H04B 1/0475* (2013.01); *H03F 3/45475* (2013.01); *H03F 2203/45034* (2013.01)

(58) Field of Classification Search
CPC ..... H04L 25/0266; H04L 7/033; H04L 25/06; H04L 5/023; H04L 25/03057; H04L 25/03038; H04L 25/03885; H04L 25/03159; H04L 2025/0349; H04L 25/14; H04L 25/4925; H04L 5/20; H04L 25/0272; H04L 25/49; H04M 11/06
USPC ................ 375/219–220, 229–231, 286–288
See application file for complete search history.

(56) References Cited

U.S. PATENT DOCUMENTS

| | | | | |
|---|---|---|---|---|
| 4,547,685 A | * | 10/1985 | Wong | H03K 3/286 327/54 |
| 4,918,399 A | * | 4/1990 | Devecchi | H03F 3/45475 330/253 |
| 5,425,052 A | * | 6/1995 | Webster | H04B 3/23 333/112 |
| 5,764,695 A | * | 6/1998 | Nagaraj | H04L 25/03885 375/232 |
| 5,870,046 A | * | 2/1999 | Scott | H04B 14/062 341/143 |

(Continued)

*Primary Examiner* — James M Perez
(74) *Attorney, Agent, or Firm* — Meyertons Hood Kivlin Kowert and Goetzel PC; Rory D. Rankin

(57) ABSTRACT

Systems, apparatuses, and methods for implementing a negative resistance circuit for bandwidth extension are disclosed. Within a feedback path of a differential signal path, capacitors are placed on the inputs and outputs of a fully differential amplifier connecting to the differential signal path. In one embodiment, a circuit includes a fully differential amplifier and four capacitors. A first capacitor is coupled between a first signal path and a non-inverting input terminal of the amplifier and a second capacitor is coupled between the first signal path and a non-inverting output terminal of the amplifier. A third capacitor is coupled between a second signal path and an inverting input terminal of the amplifier and a fourth capacitor is coupled between the second signal path and an inverting output terminal of the amplifier. The first and second signal paths carry a differential signal.

20 Claims, 8 Drawing Sheets

(56) References Cited

U.S. PATENT DOCUMENTS

| | | | | |
|---|---|---|---|---|
| 6,137,827 A * | 10/2000 | Scott | .................. | H04L 25/0266 375/219 |
| 6,323,800 B1 * | 11/2001 | Chiang | ................ | H03M 1/442 341/155 |
| 6,442,271 B1 * | 8/2002 | Tuttle | ................. | H04L 25/0266 379/399.01 |
| 6,985,005 B1 * | 1/2006 | Kim | ................... | H03F 3/45179 326/21 |
| 7,135,884 B1 * | 11/2006 | Talbot | ................ | H03K 17/164 326/30 |
| 7,221,192 B1 * | 5/2007 | Talbot | ............... | G01R 31/3163 327/407 |
| 7,256,627 B1 * | 8/2007 | Talbot | ..................... | G06F 1/12 327/141 |
| 7,256,652 B1 * | 8/2007 | Fang | ...................... | H03F 1/52 330/253 |
| 7,358,771 B1 * | 4/2008 | Talbot | ............... | H03K 19/0175 326/30 |
| 7,505,332 B1 * | 3/2009 | Talbot | .................. | H04L 1/0045 365/189.09 |
| 7,506,222 B1 * | 3/2009 | Talbot | .................. | G06F 11/1004 365/201 |
| 7,613,237 B1 * | 11/2009 | Talbot | .................. | H04L 7/0008 324/750.01 |
| 7,613,266 B1 * | 11/2009 | Talbot | .................... | H03K 5/135 327/141 |
| 7,619,472 B1 * | 11/2009 | Tekin | .................. | H03F 3/45475 330/252 |
| 7,733,163 B1 * | 6/2010 | Li | ........................ | G01R 27/14 323/314 |
| 7,861,140 B2 * | 12/2010 | Talbot | .................... | G06F 11/10 714/746 |
| 7,929,549 B1 * | 4/2011 | Talbot | .................. | H04L 9/0662 370/395.7 |
| 8,638,838 B1 * | 1/2014 | Betts | ........................ | H04L 5/16 326/30 |
| 8,843,093 B2 * | 9/2014 | De Vita | ............... | H03K 5/2481 375/351 |
| 8,928,409 B1 * | 1/2015 | Opris | .................. | H03F 3/45183 330/259 |
| 9,276,592 B2 * | 3/2016 | Lin | ........................ | H03L 7/085 |
| 9,319,039 B2 * | 4/2016 | Roytman | ................ | H03K 5/26 |
| 9,417,252 B1 * | 8/2016 | Opris | .................. | G06F 17/5072 |
| 9,444,405 B1 * | 9/2016 | Dao | .................... | H03F 1/0205 |
| 9,520,173 B1 * | 12/2016 | Baker, Jr. | ............. | G11C 11/1675 |
| 9,544,864 B1 * | 1/2017 | Takahashi | ......... | H04W 56/0015 |
| 9,762,287 B2 * | 9/2017 | Yeung | ..................... | H04B 3/32 |
| 9,837,997 B2 * | 12/2017 | Ariyama | ................. | H03K 5/24 |
| 9,847,763 B2 * | 12/2017 | Chang | ................ | H03F 3/45686 |
| 2002/0109527 A1 * | 8/2002 | Enam | ................... | H03D 7/1433 326/83 |
| 2004/0116160 A1 * | 6/2004 | Deas | ........................ | H04B 1/58 455/570 |
| 2006/0052962 A1 * | 3/2006 | Shipton | ............... | B41J 2/04505 702/106 |
| 2006/0077003 A1 * | 4/2006 | Chiu | ....................... | H03F 1/02 330/9 |
| 2006/0290377 A1 * | 12/2006 | Kim | .................... | G06F 13/4072 326/30 |
| 2007/0208819 A1 * | 9/2007 | Talbot | ................ | H04L 1/0026 709/208 |
| 2008/0048779 A1 * | 2/2008 | Crawley | .................. | H03F 1/26 330/258 |
| 2008/0315949 A1 * | 12/2008 | Douglas | .................. | H03F 3/453 330/253 |
| 2009/0207538 A1 * | 8/2009 | Crawley | ................. | H04L 12/10 361/56 |
| 2010/0028023 A1 * | 2/2010 | Ohta | ...................... | H04B 10/60 398/213 |
| 2011/0057302 A1 * | 3/2011 | Spehar | .................... | H01L 23/66 257/693 |
| 2011/0133974 A1 * | 6/2011 | Ono | .................... | H03M 1/0607 341/172 |
| 2011/0150243 A1 * | 6/2011 | Onishi | .................... | H02M 3/07 381/111 |
| 2011/0191480 A1 * | 8/2011 | Kobayashi | ............. | H01R 11/00 709/227 |
| 2011/0291702 A1 * | 12/2011 | Kaeriyama | ........... | H04L 7/0008 326/62 |
| 2012/0000287 A1 * | 1/2012 | Frangi | ................... | G01P 15/125 73/514.32 |
| 2012/0155529 A1 * | 6/2012 | Mangaser | ......... | H04L 25/03057 375/233 |
| 2012/0223282 A1 * | 9/2012 | Hao | ......................... | H04B 3/36 256/10 |
| 2013/0154741 A1 * | 6/2013 | Lee | ..................... | H03F 3/45071 330/260 |
| 2013/0194031 A1 * | 8/2013 | Poulton | ............... | H04L 25/0272 327/536 |
| 2013/0279549 A1 * | 10/2013 | Van de Beek | ...... | H04L 25/0266 375/219 |
| 2013/0293294 A1 * | 11/2013 | Lyden | .................... | H03G 3/008 330/69 |
| 2014/0204990 A1 * | 7/2014 | Song | ........................ | H04B 1/10 375/229 |
| 2014/0211095 A1 * | 7/2014 | Dickens | .................... | H04N 5/38 348/723 |
| 2014/0232464 A1 * | 8/2014 | Song | ........................ | H04L 27/01 330/258 |
| 2014/0266486 A1 * | 9/2014 | Paillet | .................... | H02M 3/157 331/177 V |
| 2015/0171807 A1 * | 6/2015 | Yang | ........................ | H03F 3/45475 330/260 |
| 2015/0185913 A1 * | 7/2015 | Han | ........................ | G06F 3/044 345/174 |
| 2015/0188697 A1 * | 7/2015 | Lin | ........................ | H03L 7/085 375/375 |
| 2015/0199150 A1 * | 7/2015 | Jeon | ..................... | G11C 7/1078 711/114 |
| 2015/0200635 A1 * | 7/2015 | Wang | .................... | H03F 1/0272 330/258 |
| 2015/0263676 A1 * | 9/2015 | Lu | ........................ | H03F 1/0233 330/260 |
| 2015/0340062 A1 * | 11/2015 | Barnett | .................... | G11B 5/09 360/46 |
| 2016/0125927 A1 * | 5/2016 | Wei | ........................ | G11C 11/16 365/148 |
| 2016/0173299 A1 * | 6/2016 | Islam | ................ | H04L 25/03057 375/233 |
| 2016/0226451 A1 * | 8/2016 | Vigraham | ................ | H03K 3/017 |
| 2016/0266178 A1 * | 9/2016 | Gerna | ................ | G01R 19/0092 |
| 2016/0335222 A1 * | 11/2016 | Schnell | ................ | G06F 13/4286 |
| 2016/0352387 A1 * | 12/2016 | Yeung | ....................... | H04B 3/32 |
| 2017/0005836 A1 * | 1/2017 | Agrawal | ................ | H04L 5/20 |
| 2017/0168969 A1 * | 6/2017 | Hsueh | ..................... | G06F 13/36 |
| 2017/0288617 A1 * | 10/2017 | Lin | ........................ | H03F 3/005 |
| 2018/0054223 A1 * | 2/2018 | Paraschou | ............ | H04B 1/0475 |
| 2018/0069712 A1 * | 3/2018 | Gaade | ..................... | H04L 12/10 |

\* cited by examiner

ACTIVE EQUALIZING NEGATIVE RESISTANCE AMPLIFIER FOR BI-DIRECTIONAL BANDWIDTH EXTENSION

BACKGROUND

Description of the Related Art

When high-speed data signals are transferred over signal paths, the transmitted signals can be distorted by high-frequency losses in the transmission lines. As data signals frequencies increase, losses increase. Similarly, as the lengths of the signal paths increase, the losses also increase. Because the transmitted signals become distorted, errors may be introduced during transmission from the source to a receiver. Therefore, systems and methods are desired for extending the usable bandwidth of signals.

BRIEF DESCRIPTION OF THE DRAWINGS

The above and further advantages of the methods and mechanisms may be better understood by referring to the following description in conjunction with the accompanying drawings, in which.

DETAILED DESCRIPTION OF EMBODIMENTS

Systems, apparatuses, and methods for implementing circuits for achieving bandwidth extension are contemplated. In one embodiment, alternating current (AC) capacitors are placed on the inputs and outputs of a fully differential amplifier connecting to a high speed differential signal path. Generally speaking, a differential amplifier amplifies the difference between the voltages on two inputs and suppresses voltage that is common on the inputs. In one embodiment, a circuit includes first and second signal paths, a fully differential amplifier, and four capacitors. A first capacitor is coupled between the first signal path and a non-inverting input terminal of the amplifier and a second capacitor is coupled between the first signal path and a non-inverting output terminal of the amplifier. A third capacitor is coupled between the second signal path and an inverting input terminal of the amplifier and a fourth capacitor is coupled between the second signal path and an inverting output terminal of the amplifier. The first and second signal paths carry a differential signal.

In another embodiment, multiple differential amplifiers are connected in parallel with the high speed differential signal path. The input and output terminals of each of the multiple differential amplifiers are capacitively coupled to the differential signal path. In a further embodiment, a negative resistance circuit may be utilized in a radio frequency (RF) multiplexer circuit. Common output pins are coupled to multiple physical layer interfaces via differential signal paths and multiplexing logic, and the differential signal paths are coupled to negative resistance circuits for achieving bandwidth extension. Each negative resistance circuit includes one or more amplifiers capacitively coupled to the differential signal paths.

These and other features and advantages will become apparent to those of ordinary skill in the art in view of the following detailed descriptions of the approaches presented herein.

In the following description, numerous specific details are set forth to provide a thorough understanding of the methods and mechanisms presented herein. However, one having ordinary skill in the art should recognize that the various embodiments may be practiced without these specific details. In some instances, well-known structures, components, signals, computer program instructions, and techniques have not been shown in detail to avoid obscuring the approaches described herein. It will be appreciated that for simplicity and clarity of illustration, elements shown in the figures have not necessarily been drawn to scale. For example, the dimensions of some of the elements may be exaggerated relative to other elements.

Figure 1:
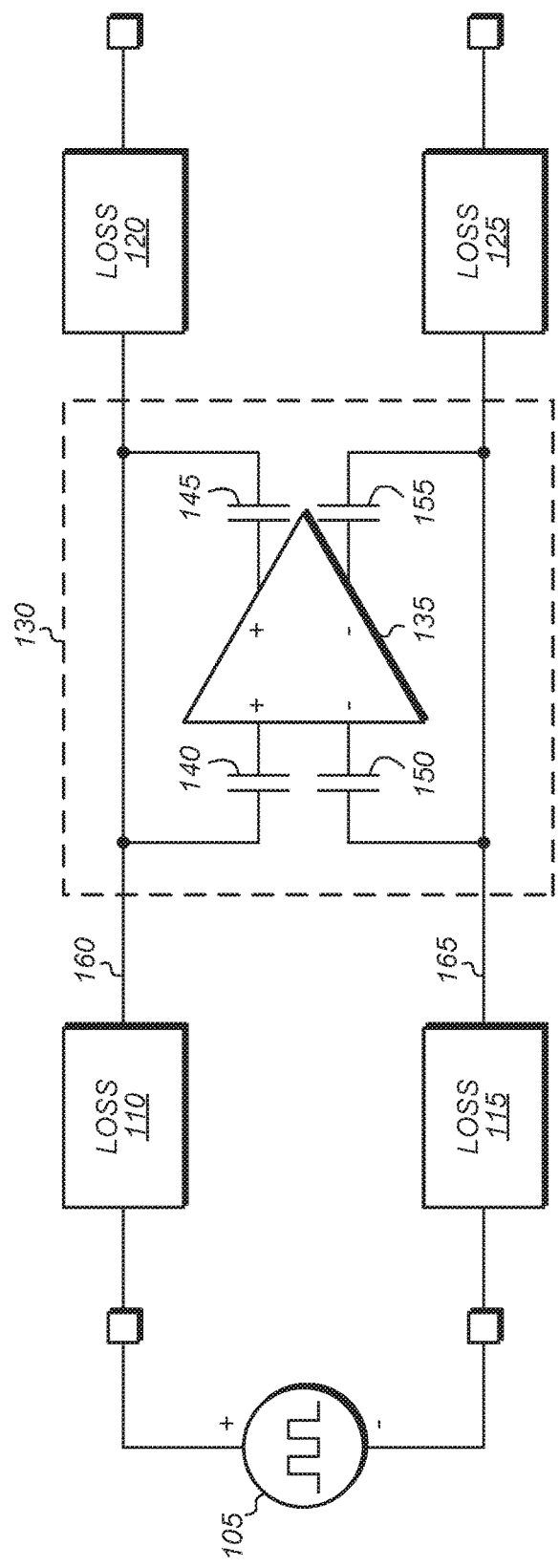
FIG. 1 is a block diagram of one embodiment of a fully differential amplifier capacitively coupled to a differential signal path.

Referring now to FIG. 1, a block diagram of one embodiment of a fully differential amplifier 135 capacitively coupled to a differential signal path is shown. Circuit 130, represented by the dashed box, includes fully differential amplifier 135 and capacitors 140, 145, 150, and 155. Circuit 130 may be referred to as a "negative resistance amplifier" or as a "bandwidth extension circuit". Also, fully differential amplifier 135 may also be referred to as amplifier 135. Transmitter 105 is coupled to circuit 130 via signal paths 160 and 165. In other embodiments, transmitter 105 is a receiver or a transceiver, and signal paths 160 and 165 carry bi-directional data.

Capacitor 140 is coupled from signal path 160 to the positive input terminal of amplifier 135. It is noted that the terms "terminal", "node", and "port" may be used interchangeably herein. The "positive input terminal" of amplifier 135 may also be referred to as the "non-inverting input terminal" of amplifier 135. Capacitor 145 is coupled from signal path 160 to the positive output terminal of amplifier 135. The "positive output terminal" of amplifier 135 may also be referred to as the "non-inverting output terminal" of amplifier 135.

Capacitor 150 is coupled from signal path 165 to the negative input terminal of amplifier 135. The "negative input terminal" of amplifier 135 may also be referred to as the "inverting input terminal" of amplifier 135. Capacitor 155 is coupled from signal path 165 to the negative output terminal of amplifier 135. The "negative output terminal" of amplifier 135 may also be referred to as the "inverting output terminal" of amplifier 135.

In one embodiment, the size of capacitor 140 is the same as the size of capacitor 150, and the size of capacitor 145 is the same as the size of capacitor 155. In various embodiments, capacitors 140, 145, 150, and 155 are tuned to optimize circuit 130 for the frequencies of interest and the characteristics (e.g., parasitic losses 110, 115, 120, and 125) of signal paths 160 and 165. The use of capacitors 140, 145, 150, and 155 in circuit 130 provide multiple advantages, including allowing the higher frequency bi-directional content on the signal paths 160 and 165 to pass through to the inputs of amplifier 135. The capacitors 140, 145, 150, and 155 also provide a gain to the signal content and feed the output back onto the signal paths 160 and 165 adding the positive feedback with the original signal. The capacitors 140, 145, 150, and 155 also provide common mode independence for the internal bias of amplifier 135 making it possible for amplifier 135 to function with a full range of common modes. The gain-bandwidth of the amplifier 135 together with the size of the capacitors 140, 145, 150, and 155 dictate the gain and frequency range that the equalization for a given circuit 130 will affect.

It is noted that although not shown in FIG. 1, amplifier 135 includes power connections for coupling to a power supply and ground. In various embodiments, amplifier 135 is powered using any type of power supply and at any of various voltages. Loss blocks 110, 115, 120, and 125 represent the parasitic losses of the signal paths 160 and 165 connecting transmitter 105 to other circuit elements (not shown). It is noted that the signal paths 160 and 165 may also be referred to as "transmission lines" or "channels". In one embodiment, signal paths 160 and 165 carry a differential signal.

Figure 2:
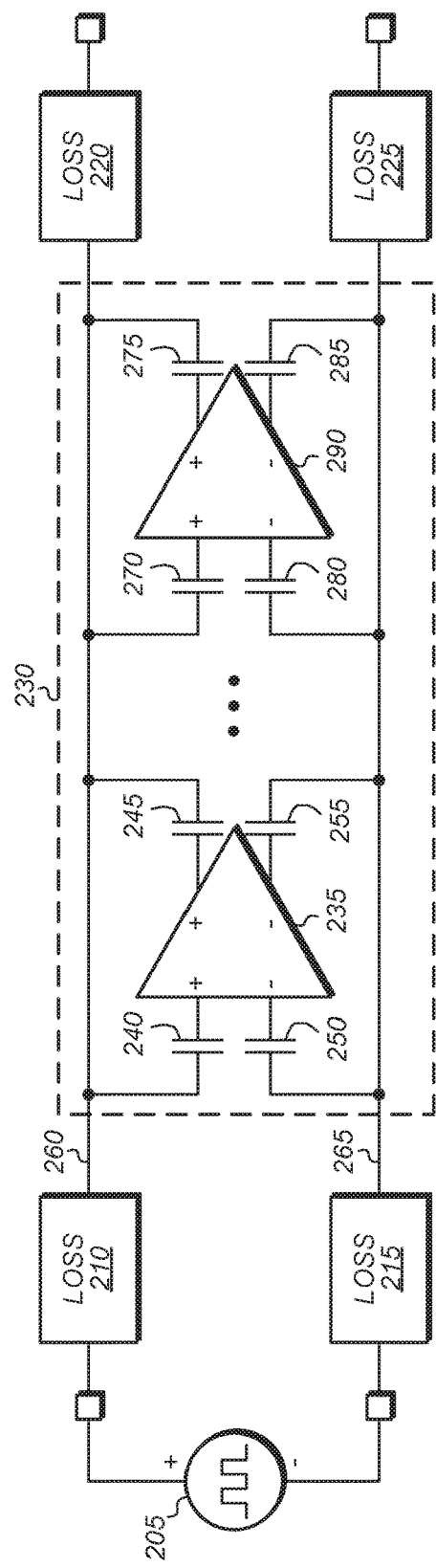
FIG. 2 is a block diagram of one embodiment of fully differential amplifiers 235 and 290 capacitively coupled to a differential signal path.

Turning now to FIG. 2, a block diagram of one embodiment of fully differential amplifiers 235 and 290 capacitively coupled to a differential signal path is shown. In other embodiments, other numbers of fully differential amplifiers are coupled to a differential signal path. Circuit 230, represented by the dashed box, includes fully differential amplifiers 235 and 290 and capacitors 240, 245, 250, 255, 270, 275, 280, and 285. Transmitter 205 is coupled to circuit 230 via signal paths 260 and 265. In other embodiments, transmitter 205 is a receiver or a transceiver, and signal paths 260 and 265 carry bi-directional data.

Capacitor 240 is coupled from signal path 260 to the positive input terminal of amplifier 235, capacitor 245 is coupled from signal path 260 to the positive output terminal of amplifier 235, capacitor 250 is coupled from signal path 265 to the negative input terminal of amplifier 235, and capacitor 255 is coupled from signal path 265 to the negative output terminal of amplifier 235. Similarly, capacitor 270 is coupled from signal path 260 to the positive input terminal of amplifier 290, capacitor 275 is coupled from signal path 260 to the positive output terminal of amplifier 290, capacitor 280 is coupled from signal path 265 to the negative input terminal of amplifier 290, and capacitor 285 is coupled from signal path 265 to the negative output terminal of amplifier 290.

In one embodiment, the size of capacitor 240 is the same as the size of capacitor 250, and the size of capacitor 245 is the same as the size of capacitor 255. Also, in one embodiment, the size of capacitor 270 is the same as the size of capacitor 280, and the size of capacitor 275 is the same as the size of capacitor 285. In various embodiments, capacitors 240, 245, 250, 255, 270, 275, 280, and 285 are tuned to optimize circuit 230 for the frequencies of interest and the characteristics (e.g., parasitic losses 210, 215, 220, and 225) of signal paths 260 and 265. The use of capacitors 240, 245, 250, 255, 270, 275, 280, and 285 in circuit 230 provide multiple advantages, including allowing the higher frequency bi-directional content on the signal paths 260 and 265 to pass through to the inputs of amplifier 235 and amplifier 290. The capacitors 240, 245, 250, 255, 270, 275, 280, and 285 also provide a gain to the signal content and feed the output back onto the signal paths 260 and 265 adding the positive feedback with the original signal. The capacitors 240, 245, 250, 255, 270, 275, 280, and 285 also provide common mode independence for the internal bias of amplifiers 235 and 290 making it possible for amplifiers 235 and 290 to function with a full range of common modes. The gain-bandwidth of the amplifiers 235 and 290 together with the size of the capacitors 240, 245, 250, 255, 270, 275, 280, and 285 dictate the gain and frequency range that the equalization for a given circuit 230 will affect.

It is noted that although not shown in FIG. 2, amplifiers 235 and 290 include power connections for coupling to a power supply and ground. In various embodiments, amplifiers 235 and 290 are powered using any type of power supply and at any of various voltages. In one embodiment, one or more of amplifiers 235 and 290 can be turned off by one or more control signals. For example, signals carried on signal paths 260 and 265 can vary from one scenario to the next, and a first scenario can utilize a single active amplifier within circuit 230 while a second scenario can utilize multiple active amplifiers within circuit 230. In another embodiment, one or more of capacitors 240, 245, 250, 255, 270, 275, 280, and 285 are variable capacitors with their capacitance controllable via one or more control signals. For example, circuit 230 can be tuned for a first scenario by adjusting one or more of capacitors 240, 245, 250, 255, 270, 275, 280, and 285 and then circuit 230 can be tuned for a second scenario by making different adjustments to one or more of capacitors 240, 245, 250, 255, 270, 275, 280, and 285.

Figure 3:
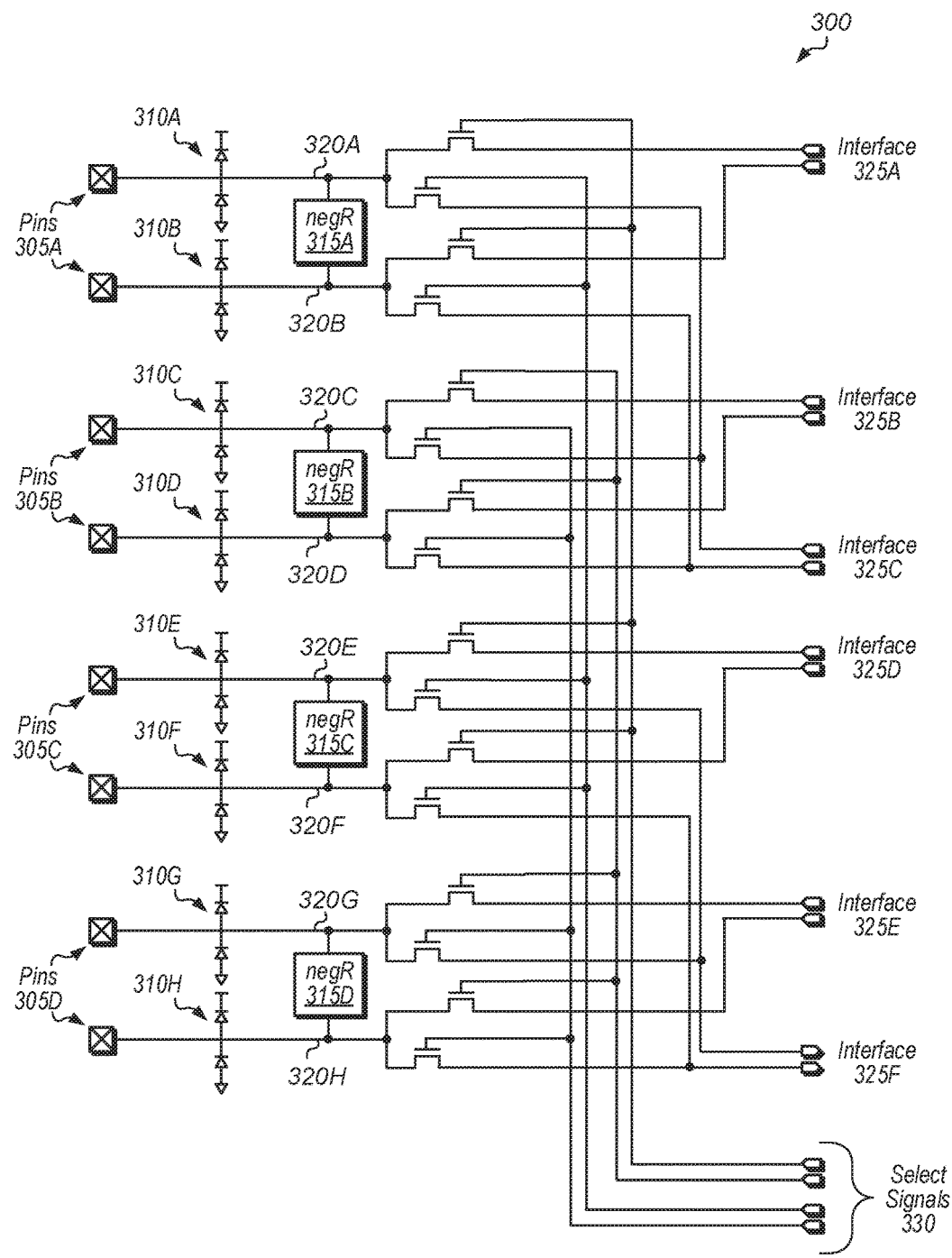
FIG. 3 is a block diagram of one embodiment of a radio frequency (RF) multiplexer.

Referring now to FIG. 3, a block diagram of a radio frequency (RF) multiplexer 300 is shown. Multiplexer (or mux) 300 includes four pairs of differential output pins 305A-D. In other embodiments, mux 300 includes other numbers of pairs of differential output pins. Each output pin is coupled to a corresponding transmission coil (or t-coil) 310A-H. It is noted that each pair of output pins 305A-D is configured to receive or transmit data. Accordingly, signal paths 320A-F are used to convey bi-directional data. In one embodiment, output pins 305A-D are used for a universal serial bus (USB) type C connector which is compatible with the USB 3.1 specification. In another embodiment, output pins 305A-D are used for a DisplayPort connector. In other embodiments, output pins 305A-D are used for other types of connectors.

The signal paths coming out of each pair of t-coils are coupled to negative resistance (or negR) blocks 315A-D. For example, signal paths 320A and 320B are coupled to negR block 315A, signal paths 320C and 320D are coupled to negR block 315B, signal paths 320E and 320F are coupled to negR block 315C, and signal paths 320G and 320H are coupled to negR block 315D. The negative resistance blocks 315A-D may also be referred to as "negative resistance amplifiers" or as "bandwidth extension circuits". In one embodiment, each negR block 315A-D includes the circuit elements (e.g., a single fully differential amplifier) of circuit 130 of FIG. 1. In another embodiment, each negR block 315A-D includes the circuit elements (e.g., multiple fully differential amplifiers) of circuit 230 of FIG. 2.

Signal paths 320A-B are coupled through multiplexing logic to either interface 325A or to interface 325C. In one embodiment, interface 325A is a DisplayPort® physical layer interface and interface 325C is a universal serial bus (USB) physical layer interface. In other embodiments, interface 325A and/or interface 325C are other types of interfaces to other types of physical layers. Signal paths 320C-D are coupled through multiplexing logic to either interface 325B or to interface 325C. In one embodiment, interface 325B is a DisplayPort physical layer interface. In other embodiments, interface 325B is any of various other types of physical layer interfaces.

Similarly, signal paths 320E-F are coupled through multiplexing logic to either interface 325D or to interface 325F. In one embodiment, interface 325D is a DisplayPort physical layer interface and interface 325F is a universal serial bus (USB) physical layer interface. In other embodiments, interface 325D and/or interface 325F are other types of physical layer interfaces. Signal paths 320G-H are coupled through multiplexing logic to either interface 325E or to interface 325F. In one embodiment, interface 325E is a DisplayPort physical layer interface. In other embodiments, interface 325E is any of various other types of physical layer interfaces. Select signals 330 are utilized to select which interfaces the signal paths 320A-H are coupled to via the multiplexing logic shown in RF mux 300. It is noted that RF mux 300 illustrates one possible embodiment of multiplexing logic which is utilized to connect output pins 305A-D to interfaces 325A-F. In other embodiments, other suitable configurations of multiplexing logic can be utilized in RF mux 300. These other embodiments include any number of output pins and/or any number of physical layer interfaces.

Figure 4:
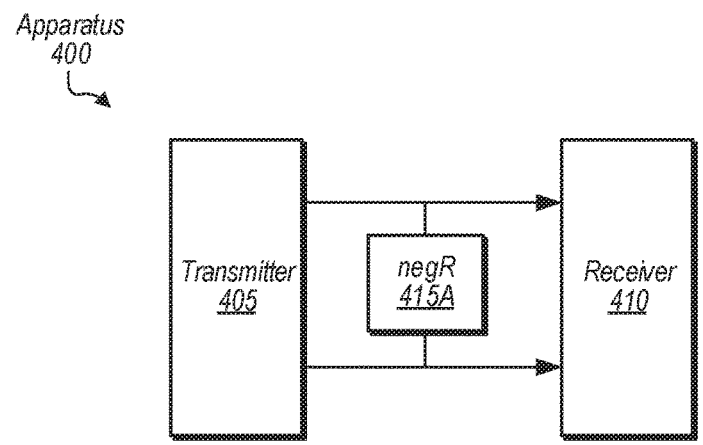
FIG. 4 illustrates block diagrams of apparatuses in accordance with one or more embodiments.
Figure 4:
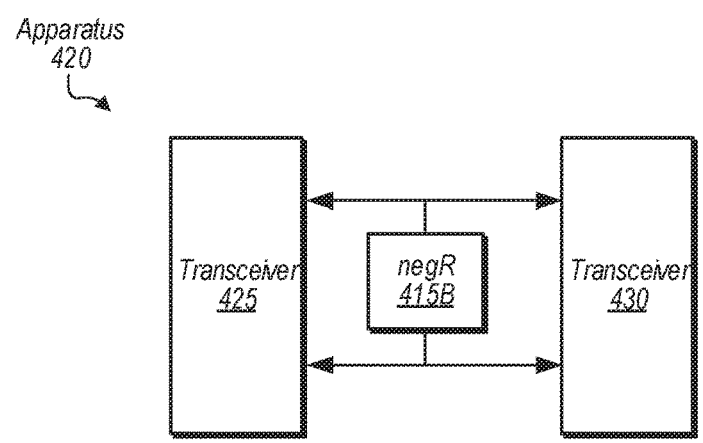

Turning now to FIG. 4, block diagrams of apparatuses 400 and 420 in accordance with one or more embodiments are shown. Apparatus 400 includes transmitter 405, receiver 410, and negative resistance amplifier (negR) 415A. Data may travel in one direction on the signal paths between transmitter 405 and receiver 410, and negR 415A provides active bandwidth extension for the uni-directional signals carried between transmitter 405 and receiver 410. In one embodiment, negR block 415A includes the circuit elements (e.g., a single fully differential amplifier) of circuit 130 of FIG. 1. In another embodiment, negR block 415A includes the circuit elements (e.g., multiple fully differential amplifiers) of circuit 230 of FIG. 2.

Apparatus 420 includes transceiver 425, transceiver 430, and negR 415B. In one scenario, transceiver 425 transmits data to transceiver 430, and in another scenario, transceiver 430 transmits data to transceiver 425. Data travels in both directions on the signal paths between transceiver 425 and transceiver 430, and negR 415B provides active bi-directional bandwidth extension for the bi-directional signals carried between transceiver 425 and transceiver 430. In one embodiment, negR block 415B includes the circuit elements of circuit 130 and in another embodiment, negR block 415B includes the circuit elements of circuit 230.

Figure 5:
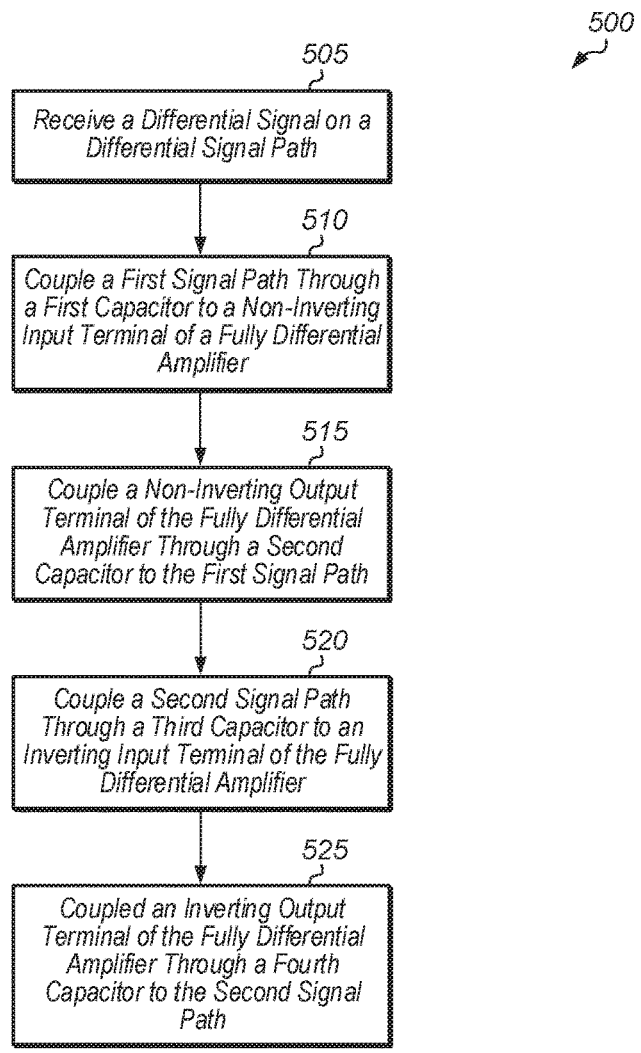
FIG. 5 is a generalized flow diagram illustrating one embodiment of a method for implementing a negative resistance circuit for bandwidth extension.

Referring now to FIG. 5, one embodiment of a method 500 for implementing a negative resistance circuit for bandwidth extension is shown. For purposes of discussion, the steps in this embodiment are shown in sequential order. It should be noted that in various embodiments of the method described below, one or more of the elements described are performed concurrently, in a different order than shown, or are omitted entirely. Other additional elements are also performed as desired. Any of the various systems or apparatuses described herein are configured to implement method 500.

A circuit receives a differential signal on a differential signal path (block 505). The differential signal path includes a first signal path and a second signal path, and the differential signal includes a first signal conveyed on the first signal path and a second signal conveyed on the second signal path. Depending on the embodiment, the first and second signal paths are constructed using traces, wires, or any other suitable conductive material. The first signal path is coupled through a first capacitor to a non-inverting input terminal of a fully differential amplifier (block 510). Also, a non-inverting output terminal of the fully differential amplifier is coupled through a second capacitor to the first signal path (block 515). Also, the second signal path is coupled through a third capacitor to an inverting input terminal of the fully differential amplifier (block 520). Still further, an inverting output terminal of the fully differential amplifier is coupled through a fourth capacitor to the second signal path (block 525). After block 525, method 500 may end.

Figure 6:
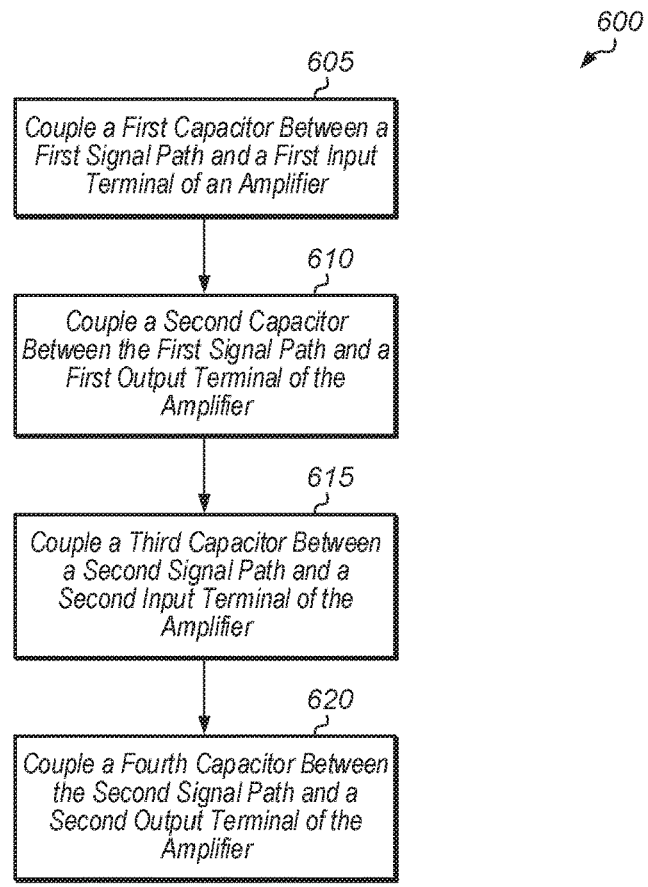
FIG. 6 is a generalized flow diagram illustrating one embodiment of a method for implementing a negative resistance circuit for bandwidth extension.

Turning now to FIG. 6, one embodiment of a method 600 for implementing a negative resistance circuit for bandwidth extension is shown. For purposes of discussion, the steps in this embodiment are shown in sequential order. It should be noted that in various embodiments of the method described below, one or more of the elements described are performed concurrently, in a different order than shown, or are omitted entirely. Other additional elements are also performed as desired. Any of the various systems or apparatuses described herein are configured to implement method 600.

A first capacitor is coupled between a first signal path and a first input terminal of an amplifier (block 605). In one embodiment, the amplifier is a fully differential amplifier. In other embodiments, the amplifier is any of various other types of amplifiers. In one embodiment, the first input terminal is a non-inverting input terminal of the amplifier. A second capacitor is coupled between the first signal path and a first output terminal of the amplifier (block 610). In one embodiment, the first output terminal is a non-inverting output terminal of the amplifier.

A third capacitor is coupled between a second signal path and a second input terminal of the amplifier (block 615). In one embodiment, the second input terminal is an inverting input terminal of the amplifier. A fourth capacitor is coupled between the second signal path and a second output terminal of the amplifier (block 620). In one embodiment, the second output terminal is an inverting output terminal of the amplifier. After block 620, method 600 ends.

Figure 7:
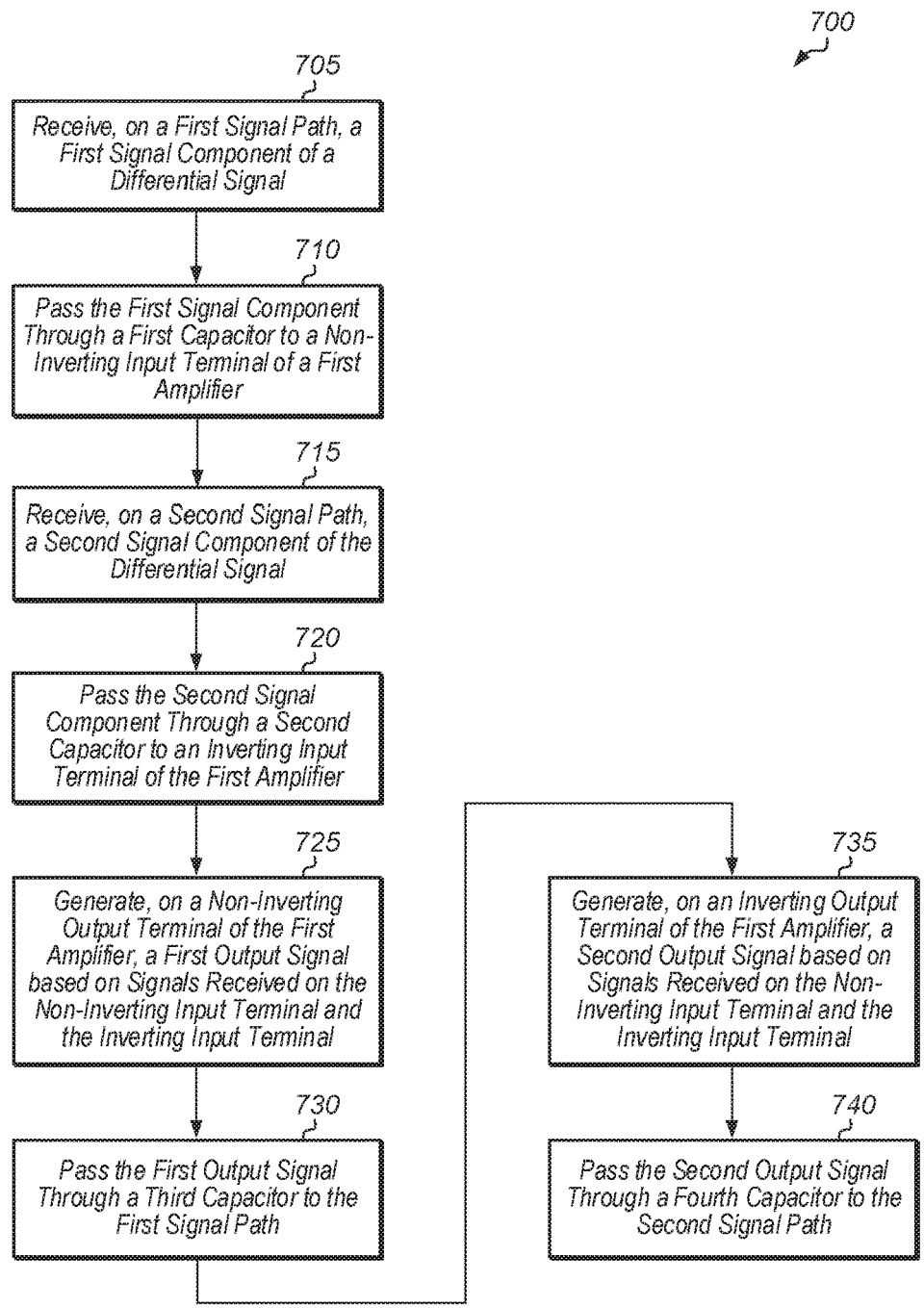
FIG. 7 is a generalized flow diagram illustrating another embodiment of a method for implementing a negative resistance circuit for bandwidth extension.

Referring now to FIG. 7, another embodiment of a method 700 for implementing a negative resistance circuit for bandwidth extension is shown. For purposes of discussion, the steps in this embodiment are shown in sequential order. It should be noted that in various embodiments of the method described below, one or more of the elements described are performed concurrently, in a different order than shown, or are omitted entirely. Other additional elements are also performed as desired. Any of the various systems or apparatuses described herein are configured to implement method 700.

A first signal component of a differential signal is received on a first signal path (block 705). The first signal component is passed through a first capacitor to a non-inverting input terminal of a first amplifier (block 710). A second signal component of the differential signal is received on a second signal path (block 715). The second signal component is passed through a second capacitor to an inverting input terminal of the first amplifier (block 720).

The first amplifier generates, on a non-inverting output terminal, a first output signal based on signals received on the non-inverting input terminal and the inverting input terminal (block 725). The first output signal is passed through a third capacitor to the first signal path (block 730). The first amplifier also generates, on an inverting output terminal of the first amplifier, a second output signal based on signals received on the non-inverting input terminal and the inverting input terminal (block 735). The second output signal is passed through a fourth capacitor to the second signal path (block 740). In one embodiment, the first amplifier is a fully differential amplifier. Additionally, in one embodiment, the first capacitor is a same size as the second capacitor, and the third capacitor is a same size as the fourth capacitor. In some embodiments, a second amplifier is capacitively coupled to the first signal path and the second signal path in a similar manner to the first amplifier. After block 740, method 700 ends.

Figure 8:
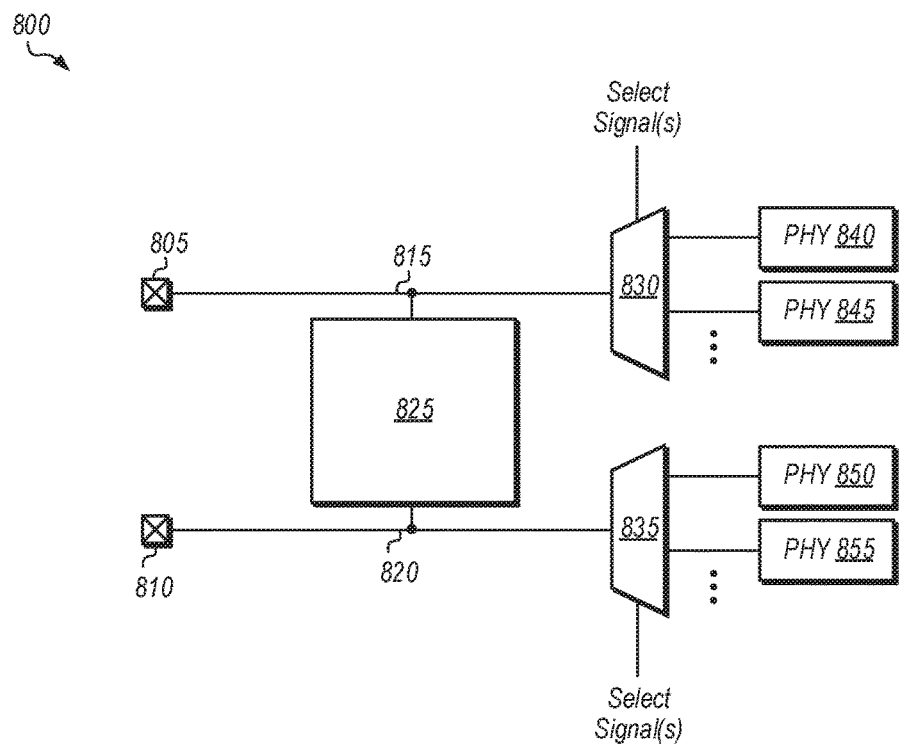
FIG. 8 is a block diagram of one embodiment of a circuit.

Turning now to FIG. 8, a block diagram of one embodiment of a circuit 800 for multiplexing signals compliant with multiple protocols is shown. Circuit 800 includes output pads 805 and 810, signal paths 815 and 820, circuit 825, multiplexers 830 and 835, and physical layer (PHY) logical units 840, 845, 850, and 855. In one embodiment, the logic of circuit 800 is included on a single semiconductor die. It is noted that the logic of circuit 800 can be repeated for apparatuses which include multiple pairs of pads. For example, in one embodiment, the logic of circuit 800 can be duplicated four times and utilized for four pairs of pads in a similar fashion to the logic shown in the apparatus of FIG. 3.

Circuit 825 can be referred to as a "negative resistance amplifier" or as a "bandwidth extension circuit". In one embodiment, circuit 825 includes the components of circuit 130 of FIG. 1. In another embodiment, circuit 825 includes the components of circuit 230 of FIG. 1. In other embodiments, circuit 825 can include other arrangements of components.

In one embodiment, pads 805 and 810 are connected to a USB type-C connector (not shown). It is noted that one or more components can be located between signal path 815 and pad 805 and signal path 820 and pad 810. Additionally, one or more components can be located between pads 805 and 810 and the USB type-C connector. In other embodiments, pads 805 and 810 can be connected to other types of connectors. Pads 805 and 810 are connected to signal paths 815 and 820, respectively, and in one embodiment, signal paths 815 and 820 can carry bidirectional signals. Signal paths 815 and 820 are coupled to circuit 825 and to multiplexers 830 and 835, respectively. Multiplexer 830 is configured to select which one of a plurality of signal paths is connected to signal path 815. Similarly, multiplexer 835 is configured to select which one of a plurality of signal paths are connected to signal path 820.

In one embodiment, PHY 840 and PHY 850 transmit or receive a first differential pair of signals. In this embodiment, PHY 845 and PHY 855 transmit or receive a second differential pair of signals. In one embodiment, PHY 840 and PHY 850 are USB PHY's and PHY 845 and PHY 855 are DisplayPort PHY's. In other embodiments, PHY 840 and PHY 850 can be another type of PHY and PHY 845 and PHY 850 can be another type of PHY. Generally speaking, in one embodiment, the signals passing through multiplexers 830 and 835 to/from PHY 840 and PHY 850, respectively, are compliant with a first protocol, the signals passing through multiplexers 830 and 835 to/from PHY 845 and PHY 850, respectively, are compliant with a second protocol, with the second protocol being different from the first protocol.

Multiplexer 830 and multiplexer 835 can also connect to more than two different signal paths in other embodiments. For example, in another embodiment, multiplexer 830 can select which one of three signal paths to connect to signal path 815. In other embodiments, multiplexer 830 can select from four signal paths, five signal paths, and so on for connecting to signal path 815. Multiplexer 835 can also select from three or more signal paths to connect to signal path 820 in other embodiments.

In various embodiments, program instructions of a software application can be used to adjust the gain/bandwidth of the apparatuses and systems described herein for a given channel loss. The program instructions can also be used to perform various other functions. The program instructions describe the behavior of hardware in a high-level programming language, such as C. Alternatively, a hardware design language (HDL) is used, such as Verilog. The program instructions are stored on a non-transitory computer readable storage medium. Numerous types of storage media are available. The storage medium is accessible by a computing system during use to provide the program instructions and accompanying data to the computing system for program execution. The computing system includes at least one or more memories and one or more processors configured to execute program instructions.

It should be emphasized that the above-described embodiments are only non-limiting examples of implementations. Numerous variations and modifications will become apparent to those skilled in the art once the above disclosure is fully appreciated. It is intended that the following claims be interpreted to embrace all such variations and modifications.

What is claimed is:

1. An apparatus for bandwidth extension, the apparatus comprising:
    a first amplifier; and
    a plurality of capacitors;
    a first multiplexor configured to select which one of a first plurality of signal paths is connected to a first signal path, and a second multiplexer configured to select which one of a second plurality of signal paths is connected to a second signal path, wherein each of the first signal path and second signal path is connected to a pad that is connected to a USB connector, wherein a first signal received by the first multiplexer is compliant with a universal serial bus protocol, and wherein a second signal received by the first multiplexer is compliant with a DisplayPort protocol;
    wherein the apparatus is configured to:
        receive a first signal component of a differential signal on a first signal path;
        pass the first signal component through a first capacitor to a non-inverting input terminal of a first amplifier;
        receive a second signal component of the differential signal on a second signal path; and
        pass the second signal component through a second capacitor to an inverting input terminal of the first amplifier; and
    wherein the first signal is generated by a first physical layer (PHY) logical unit, the second signal is generated by a second PHY logical unit, and wherein the first amplifier, first multiplexer, second multiplexer, first PHY logical unit, and second PHY logical unit are all included on a same semiconductor die.

2. The apparatus as recited in claim 1, wherein the apparatus is further configured to:
    generate, on a non-inverting output terminal of the first amplifier, a first output signal based on signals received on the non-inverting input terminal and the inverting input terminal;
    pass the first output signal through a third capacitor to the first signal path;
    generate, on an inverting output terminal of the first amplifier, a second output signal based on signals received on the non-inverting input terminal and the inverting input terminal; and pass the second output signal through a fourth capacitor to the second signal path.

3. The apparatus as recited in claim 2, wherein the first amplifier is a fully differential amplifier.

4. The apparatus as recited in claim 1, wherein the apparatus further comprises a second amplifier capacitively coupled to the first signal path and the second signal path.

5. The apparatus as recited in claim 1, wherein the first signal path and second signal path carry bi-directional signals.

6. The apparatus as recited in claim 1, wherein the first signal path and second signal path carry uni-directional signals.

7. The apparatus as recited in claim 1, wherein the first capacitor is a same size as the second capacitor, and wherein the third capacitor is a same size as the fourth capacitor.

8. A method comprising:
selecting, by a first multiplexor, which one of a first plurality of signal paths is connected to a first signal path, and selecting, by a second multiplexer, which one of a second plurality of signal paths is connected to a second signal path, wherein each of the first signal path and second signal path is connected to a pad that is connected to a USB connector, wherein a first signal received by the first multiplexer is compliant with a universal serial bus protocol, and wherein a second signal received by the first multiplexer is compliant with a DisplayPort protocol;
receiving, on a first signal path, a first signal component of a differential signal;
passing the first signal component through a first capacitor to a non-inverting input terminal of a first amplifier;
receiving, on a second signal path, a second signal component of the differential signal;
passing the second signal component through a second capacitor to an inverting input terminal of the first amplifier; and
wherein the first signal is generated by a first physical layer (PHY) logical unit, wherein the second signal is generated by a second PHY logical unit, and wherein the first amplifier, first multiplexer, second multiplexer, first PHY logical unit, and second PHY logical unit are all included on a same semiconductor die.

9. The method as recited in claim 8, further comprising:
generating, on a non-inverting output terminal of the first amplifier, a first output signal based on signals received on the non-inverting input terminal and the inverting input terminal;
passing the first output signal through a third capacitor to the first signal path;
generating, on an inverting output terminal of the first amplifier, a second output signal based on signals received on the non-inverting input terminal and the inverting input terminal; and
passing the second output signal through a fourth capacitor to the second signal path.

10. The method as recited in claim 9, wherein the first amplifier is a fully differential amplifier.

11. The method as recited in claim 8, further comprising capacitively coupling a second amplifier to the first signal path and the second signal path.

12. The method as recited in claim 8, wherein the first signal path and second signal path carry bi-directional signals.

13. The method as recited in claim 8, wherein the first signal path and second signal path carry uni-directional signals.

14. The method as recited in claim 8, wherein the first capacitor is a same size as the second capacitor, and wherein the third capacitor is a same size as the fourth capacitor.

15. A circuit comprising:
an amplifier;
a first capacitor coupled between a first signal path and a first input terminal of the amplifier; and
a second capacitor coupled between the first signal path and a first output terminal of the amplifier;
wherein the first signal is generated by a first physical layer (PHY) logical unit, wherein the second signal is generated by a second PHY logical unit, and wherein the amplifier, first multiplexer, second multiplexer, first PHY logical unit, and second PHY logical unit are all included on a same semiconductor die;
wherein the circuit further comprises a first multiplexer coupled to the first signal path and a second multiplexer coupled to the second signal path, wherein the first multiplexer is configured to select which one of a first plurality of signal paths is connected to the first signal path, and wherein the second multiplexer is configured to select which one of a second plurality of signal paths is connected to the second signal path;
wherein a first signal received by the first multiplexer is compliant with a first protocol, wherein a second signal received by the first multiplexer is compliant with a second protocol, and wherein the second protocol is different from the first protocol, wherein the first protocol is universal serial bus (USB), wherein the second protocol is DisplayPort, and wherein the first signal path and the second signal path are coupled to pads which are connected to a USB type-C connector.

16. The circuit as recited in claim 15, wherein the first input terminal of the amplifier is a non-inverting input terminal, wherein the first output terminal of the amplifier is a non-inverting output terminal.

17. The circuit as recited in claim 16, wherein the circuit further comprises:
a third capacitor coupled between a second signal path and a second input terminal of the amplifier; and
a fourth capacitor coupled between the second signal path and a second output terminal of the amplifier.

18. The circuit as recited in claim 17, wherein the second input terminal of the amplifier is an inverting input terminal, wherein the second output terminal of the amplifier is an inverting output terminal.

19. The circuit as recited in claim 17, wherein the first and second signal paths carry a differential signal.

20. The circuit as recited in claim 17, wherein the amplifier is a fully differential amplifier.

* * * * *